United States Patent [19]
Tilly

[11] Patent Number: 4,716,374
[45] Date of Patent: Dec. 29, 1987

[54] ADAPTIVE ANALOG VARIABLE LIMITER

[75] Inventor: Peter E. Tilly, Cedar Rapids, Iowa

[73] Assignee: Rockwell International Corporation, El Segundo, Calif.

[21] Appl. No.: 874,244

[22] Filed: Jun. 13, 1986

[51] Int. Cl.$^4$ .............................................. H03K 5/08
[52] U.S. Cl. .................................. 328/169; 307/264; 307/362
[58] Field of Search ............... 307/264, 362, 540, 549, 307/550, 555, 568; 328/168, 169, 173

[56] References Cited
U.S. PATENT DOCUMENTS
3,697,780 10/1972 Michael et al. ..................... 307/360
3,999,084 12/1976 Beaudette ........................ 307/362 X Primary Examiner—Eugene R. LaRoche
Assistant Examiner—Steven J. Mottola
Attorney, Agent, or Firm—Robert C. Mayes; Gregory G. Williams; H. Frederick Hamann

[57] ABSTRACT

An amplifier signal limiter is disclosed which has the operational capability of tracking slowly varying signal components while precluding errant transient outputs, and has a programmable limit range which is independently controllable for broader or narrower allowable outputs.

3 Claims, 1 Drawing Figure

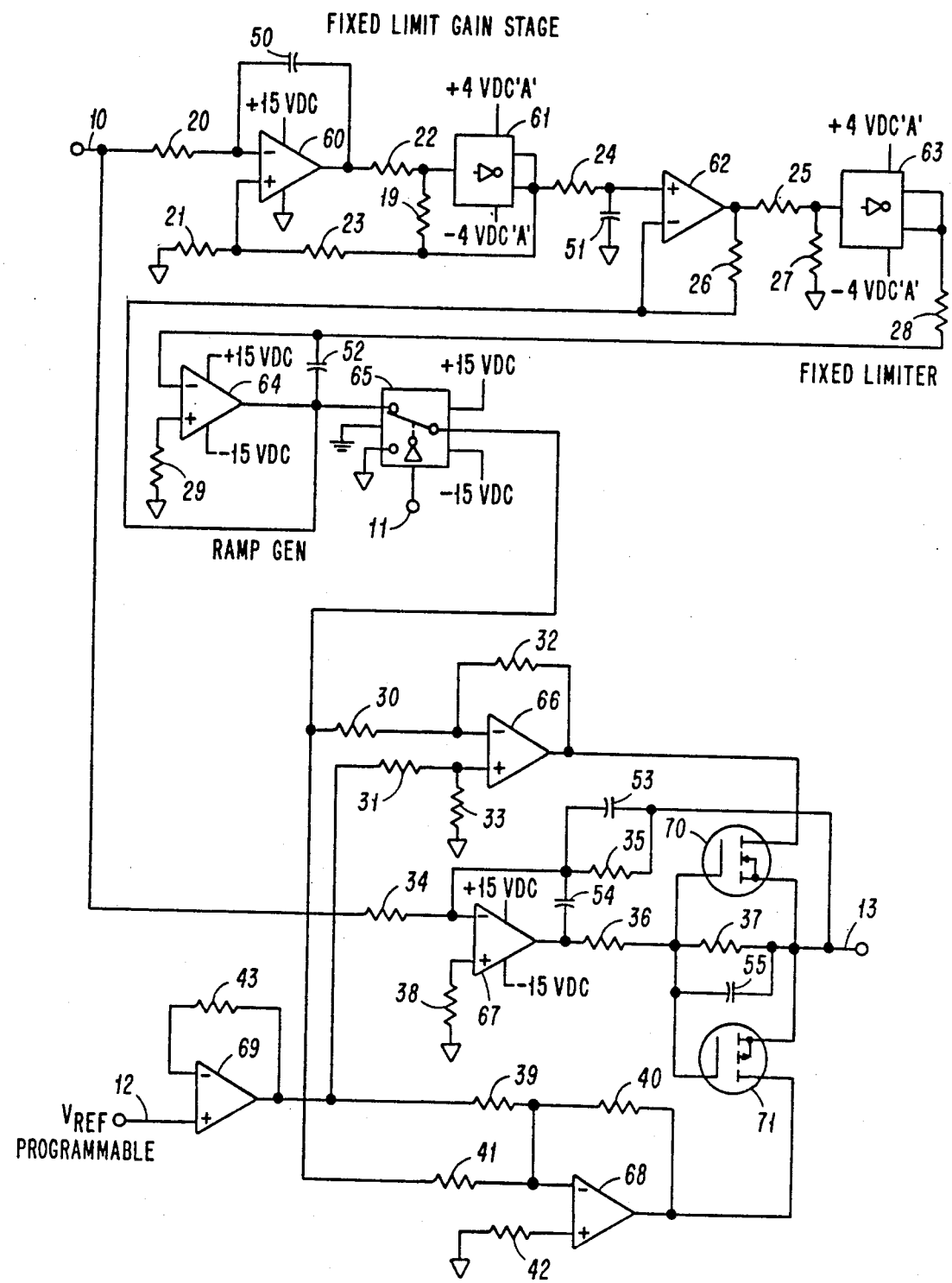

ADAPTIVE ANALOG VARIABLE LIMITER

BACKGROUND OF THE INVENTION

This invention relates generally to electronics and more particularly to variable limit controlled amplifiers for use in precision instrumentation.

The use of limiters on amplifiers in precision instrumentation has been implemented to preclude a signal output from the controlled amplifier from exceeding desired limits in particular circumstances. These limits are typically designed into the circuit in such a way that the output is rigidly bracketed or limited between two hard parameters. A problem exists in this implementation particularly in avionics equipment wherein the amplifier for a servo system must have a limited output to preclude harsh and erratic control surface movement of the aircraft, and yet be capable of much broader output range over the full flight envelope. Furthermore, the typical configuration of having the computer implementation for this feature to control both gain and limits causes some concern relative to detectable failure modes if the single computer should fail. This situation would reduce the reliability for the limit control aspect.

SUMMARY AND BRIEF DESCRIPTION OF THE DRAWING

Accordingly, it is an object of the present invention to provide a circuit having limits for a servo amplifier which are variable as a function of changing amplifier output.

Another object of the present invention is to provide a variable limiter circuit capable of precluding errant amplifier outputs and yet being adaptive to the changing amplifier output.

A yet further objective of the present invention is to provide a circuit establishing an upper and a lower output limit for an amplifier wherein the limits preclude rapid and erratic servo output beyond the limited values, but allow relatively slowly varying amplifier increases and decreases in the output to actually modify the limits.

Another objective of the present invention is to provide a circuit having upper and lower output limits for an amplifier wherein the limits define a range of allowable output and that allowable range is variable dependent upon operational requirements of the amplifier.

Briefly, and in accordance with the present invention, an improved amplifier circuit having a variable limited output comprises a signal limited servo amplifier having both a maximum positive and a maximum negative output current values in a first mode, and includes means for controlling the maximum values in alternate modes wherein the values define limits for the amplifier, the limits are variable independent of gain, and the limits define a bracket for signals amplified by the amplifier. The circuit disclosed herein establishes a bracket around the amplifier output which precludes errant amplifier outputs from exceeding those limited values, and yet allows a gradual increase or decrease in amplifier output by requiring the bracket limits to follow the amplifier output components having a slower time period.

In alternative embodiments, the bracket defining the upper and lower limits has a variable range which, in addition to defining tolerances, can narrow or widen allowable signal outputs as may be desired. In specific operating conditions the range may be widened during landing and take-off conditions of slower flight, for example to allow a wider control range option as potentially require in that region of the flight envelope. The faster the aircraft travels, the more aerodynamic authority the control surfaces have; therefore, the limits are narrowed at higher speeds to keep stress on the airframe within acceptable limits.

Other objectives and advantages of the present invention will become apparent upon reading the following detailed description in conjunction with the drawing, in which a schematic circuit diagram of one embodiment of the present invention is shown.

DETAILED DESCRIPTION

With reference to the drawing, the fixed limit gain stage input, the analog input to node 10, is provided directly through amplifier 67 to output 13 as well as to provide the limit establishment through amplifier 60 through inverter 61 to the fixed limiter stage, through amplifier 62 to provide one limit and the output of inverter 63 providing the other limit. The plus and minus 4 volt reference for inverter 63, together with the time constant defined by the resistor 28 and capacitor 52 control the slope of the ramp function, and thereby the adaptive speed of the response for the variable limits.

It can be seen that the ramp generator configuration allows for the high frequency components to be essentially filtered from the fixed limiter stage while maintaining the slower varying component essentially intact. The output of the ramp generator 64 is applied to both of the limit establishment amplifiers 66, 68 providing an input signal sensitive limit control. The switch 65 allows the deselection of the ramp generator function. This in turn defeats the adaptive variability of the limits and is useful in specific circumstances. For example, the slower flight regions will require much greater range, thereby requiring a broader limit range input on node 13 as a higher value for $V_{ref}$ (programmable). During this flight phase the tracking feature of the instant invention becomes less beneficial and can be decoupled at node 11.

The limit control is further variable with the voltage reference input on node 12, which is controllable, allowing the establishment of the breadth of the allowable range. This breadth is the difference between the upper and lower limits as may be required in specific implementations. It should be further noted that in specific operational circumstances, the voltage reference, at node 12, can be varied to more closely correspond to actual limit control requirements by narrowing the range allowable or broadening the range allowable in specific instances. The actual servo signal is passed from node 10 through amplifier 67 to the output 13 and is held within range by the source followers 70, 71 which are controlled by the respective limit establishment amplifiers 66, 68, respectively.

In this manner, the limits are varied to correspond with the slower varying component of the input signal, providing an allowable increase in actual output at node 13, while precluding sudden errant signals out. Furthermore, the breadth of the range is readily controlled by defining the voltage reference input on node 12.

The active components used in this exemplary embodiment were Linear Technology LT1014 quad op amps, 60, 62, 64, 66, 67, 68, 69; and the inverters 61, 63 were RCA CD4007s. The switch 65 was an Analog Devices 7512, and the field effect transistors 70, 71 were International Rectifier IRF112, and IRF9123, respectively.

It can therefore be seen that the amp 60 and inverter 61 provide precision fixed limits. The amps 60, 62 and inverter 63 provide an inverting integrator, which in combination with R28 and C52 define the slope of the ramp generated, and applied, to the limiting amps 66, 68 to vary the limits as a function of signal in. Those limits are a function of the very low source impedance of these operational amplifiers.

While this invention has been described with reference to a specific example, it is not intended that this description be construed in a limiting sense. Various modifications of this example, as well as other embodiments of the invention, will be apparent to persons skills in the art upon reference to this description. It is therefore contemplated that the appended claims will cover any such modifications of embodiments as fall within the true scope of the invention.

I claim:

1. An analog variable output limiter for an amplifier, comprising:

means for limiting an output value of said amplifier to a select range of possible values, said range having upper and lower limits; and means for varying said limits, while maintaining said range substantially constant, and following said output value as a time function slower than potential amplifier output fluctuations, thereby precluding sudden errant outputs outside said range limits and permitting said range to follow slower varying amplifier outputs, said means for limiting includes voltage references comparator coupled operational amplifiers, and said means for varying said limits includes a ramp generator coupled to said comparator coupled operational amplifiers.

2. A circuit as in claim 1 wherein said means for limiting includes variable voltage reference coupled to said comparator coupled operational amplifiers, for controlling said range of possible values.

3. A circuit as in claim 1 further comprising means for varying said range to expand and alternatively to narrow said possible values in conjunction with said range following said more slowly varying component of said output.

* * * * *